United States Patent
Conn (10) Patent No.: US 8,404,585 B2
(45) Date of Patent: Mar. 26, 2013

(54) PREVENTING BREAKAGE OF LONG METAL SIGNAL CONDUCTORS ON SEMICONDUCTOR SUBSTRATES

(75) Inventor: Robert O. Conn, Laupahoehoe, HI (US)

(73) Assignee: Research Triangle Institute, Research Triangle Park, NC (US)

( * ) Notice: Subject to any disclaimer, the term of this patent is extended or adjusted under 35 U.S.C. 154(b) by 71 days.

(21) Appl. No.: 13/135,510

(22) Filed: Jul. 7, 2011

(65) Prior Publication Data

US 2011/0266034 A1    Nov. 3, 2011

Related U.S. Application Data

(63) Continuation of application No. 11/975,058, filed on Oct. 16, 2007, now Pat. No. 7,999,388.

(60) Provisional application No. 60/995,194, filed on Sep. 24, 2007.

(51) Int. Cl.
*H01L 21/44* (2006.01)

(52) U.S. Cl. . 438/666; 438/667; 257/773; 257/E21.627; 257/E21.641

(58) Field of Classification Search .................. 438/666, 438/667; 257/E23.169–E23.178, E21.575–E21.597, 257/E21.627, E21.641, 773
See application file for complete search history.

(56) References Cited

U.S. PATENT DOCUMENTS

| | | | |
|---|---|---|---|
| 5,172,310 A | 12/1992 | Deam et al. | 363/144 |
| 5,208,491 A | 5/1993 | Ebeling et al. | 326/41 |
| 5,236,118 A | 8/1993 | Bower et al. | 228/193 |
| 5,511,428 A | 4/1996 | Goldberg et al. | 731/777 |
| 5,655,290 A | 8/1997 | Moresco et al. | 29/830 |
| 5,790,771 A | 8/1998 | Culbertson et al. | 714/3 |
| 5,805,533 A | 9/1998 | Daigle et al. | 368/226 |
| 5,834,705 A | 11/1998 | Jonaidi | 174/261 |
| 5,891,761 A | 4/1999 | Vindasius et al. | 438/109 |
| 5,949,030 A | 9/1999 | Fasano et al. | 174/262 |
| 6,206,705 B1 | 3/2001 | Bolotin et al. | 439/69 |
| 6,221,769 B1 | 4/2001 | Dhong et al. | 438/667 |
| 6,259,160 B1 | 7/2001 | Lopatin et al. | 257/762 |
| 6,379,982 B1 | 4/2002 | Ahn et al. | 438/14 |
| 6,555,467 B2 | 4/2003 | Hsu et al. | 438/633 |
| 6,598,216 B2 | 7/2003 | Chan et al. | 716/13 |
| 6,650,301 B1 * | 11/2003 | Zimmerman | 343/803 |
| 6,660,564 B2 | 12/2003 | Brady | 438/119 |
| 6,694,464 B1 | 2/2004 | Quayle et al. | 714/725 |
| 6,721,171 B2 * | 4/2004 | Masuda et al. | 361/523 |
| 6,768,205 B2 | 7/2004 | Taniguchi et al. | 257/774 |
| 6,827,584 B2 * | 12/2004 | Mathieu et al. | 439/66 |
| 6,873,518 B2 * | 3/2005 | Masuda et al. | 361/525 |
| 7,048,548 B2 | 5/2006 | Mathieu et al. | 439/66 |
| 7,315,226 B2 * | 1/2008 | Tohya et al. | 333/182 |
| 7,344,906 B2 * | 3/2008 | Chua et al. | 438/48 |
| 7,405,698 B2 * | 7/2008 | de Rochemont | 343/700 MS |
| 7,409,610 B1 | 8/2008 | Drimer | 714/725 |

(Continued)

*Primary Examiner* — Marcos D. Pizarro
*Assistant Examiner* — Bilkis Jahan
(74) *Attorney, Agent, or Firm* — Imperium Patent Works; Zheng Jin; Darien K. Wallace (57) ABSTRACT

An apparatus includes a volume of insulator disposed over a top surface of a semiconductor substrate, a tube of soft dielectric, and a metal conductor. The insulator has a hardness of more than approximately three gigaPascals (gPa) and the soft dielectric has a hardness of less than three gPa. The tube of soft dielectric and the metal conductor are both embedded within the volume of insulator. The tube defines a central volume and the metal conductor extends in a direction through the central volume for a distance of at least one inch. The metal conductor is encircled by the soft dielectric when the apparatus is viewed in a cross-sectional plane perpendicular to the direction. The metal conductor may include a plurality of bend portions. The metal conductor does not break when the apparatus is temperature cycled over a range from zero to eighty five degrees Celsius.

20 Claims, 10 Drawing Sheets

U.S. PATENT DOCUMENTS

| | | |
|---|---|---|
| 2002/0134581 A1 | 9/2002 | Figueroa et al. ............... 174/260 |
| 2002/0134685 A1 | 9/2002 | Chakravorty et al. ........ 205/125 |
| 2002/0163062 A1* | 11/2002 | Wang et al. ................... 257/641 |
| 2002/0164893 A1* | 11/2002 | Mathieu et al. ................. 439/66 |
| 2003/0107117 A1 | 6/2003 | Antonell et al. ............. 257/684 |
| 2004/0038195 A1 | 2/2004 | Nerenberg et al. ................ 435/4 |
| 2004/0164418 A1 | 8/2004 | Sugiura et al. ................ 257/758 |
| 2004/0179344 A1 | 9/2004 | Uchida et al. ................. 361/777 |
| 2005/0104221 A1 | 5/2005 | Memis .......................... 257/778 |
| 2006/0021729 A1* | 2/2006 | Werner et al. ................... 164/98 |
| 2006/0027934 A1* | 2/2006 | Edelstein et al. ............. 257/774 |
| 2006/0125094 A1 | 6/2006 | Lin ................................ 257/734 |
| 2006/0164189 A1* | 7/2006 | Tohya et al. .................. 333/238 |
| 2006/0170110 A1 | 8/2006 | Akram et al. .................. 257/774 |
| 2006/0190846 A1 | 8/2006 | Hichri et al. ...................... 716/1 |
| 2006/0226450 A1 | 10/2006 | Furuta et al. .................. 257/208 |
| 2007/0012475 A1 | 1/2007 | Kawaguchi et al. .......... 174/255 |
| 2007/0114668 A1 | 5/2007 | Goto et al. .................... 257/758 |
| 2007/0176622 A1 | 8/2007 | Yamazaki ..................... 257/679 |
| 2007/0210400 A1 | 9/2007 | Moribayashi et al. ........ 257/440 |
| 2008/0054486 A1 | 3/2008 | Murayama et al. ........... 257/774 |
| 2008/0253085 A1 | 10/2008 | Soffer ........................... 361/687 |

* cited by examiner (PRIOR ART)

CROSS SECTIONAL VIEW OF SUBSTRATE WITH COPPER
CONDUCTOR SURROUNDED BY LOW-K DIELECTRIC MATERIAL

FIG. 3

EXPANDED TOP-DOWN VIEW OF A
PORTION OF A COPPER TRACE

FIG. 4

BEND PORTION BEFORE
HEATING

FIG. 4A

BEND PORTION AFTER
HEATING

CROSS-SECTIONAL VIEW OF A SILICON
SUBSTRATE WITH A LAYER OF PHOTO RESIST

FIG. 13

TOP-DOWN VIEW OF A SILICON SUBSTRATE
WITH A LAYER OF PHOTO RESIST

FIG. 14

CROSS-SECTIONAL VIEW OF A SILICON SUBSTRATE WITH A PHOTO RESIST LAYER HAVING AN ANGULAR SURFACE

FIG. 15

CROSS-SECTIONAL VIEW OF A SILICON SUBSTRATE WITH AN INSULTING LAYER HAVING AN ANGULAR SURFACE

FIG. 16

CROSS-SECTIONAL VIEW OF A SILICON SUBSTRATE WITH A COPPER CONDUCTOR HAVING A CROSS-SECTIONAL SINE WAVE

FIG. 17

BEND PORTION BEFORE HEATING

FIG. 18A

BEND PORTION AFTER HEATING

FIG. 18B

PREVENTING BREAKAGE OF LONG METAL SIGNAL CONDUCTORS ON SEMICONDUCTOR SUBSTRATES

CROSS REFERENCE TO RELATED APPLICATION

This application is a continuation of, and claims priority under 35 U.S.C. §120 from, nonprovisional U.S. patent application Ser. No. 11/975,058 entitled "Preventing Breakage of Long Metal Signal Conductors on Semiconductor Substrates," filed on Oct. 16, 2007, now U.S. Pat. No. 7,999,388, the subject matter of which is incorporated herein by reference. Application Ser. No. 11/975,058 in turn claims the benefit under 35 U.S.C. §119(e) of provisional U.S. patent application Ser. No. 60/995,194, entitled "Semiconductor Substrate Stack High Performance Computer," filed on Sep. 24, 2007, the subject matter of which is incorporated herein by reference.

TECHNICAL FIELD

The described embodiments relate to semiconductor processing, and more particularly, to making long interconnect signal conductors on a silicon substrate.

BACKGROUND INFORMATION

In recent years, Copper (Cu) is commonly used in semiconductor integrated circuits for interconnections because it has better conductivity and is more reliable than other metals such as aluminum and aluminum alloys. However, mechanical stress still remains a technical challenge. The difference in thermal expansion coefficient between a copper conductor and a silicon substrate is a typical cause to mechanical stress. For example, copper expands seventeen parts-per-million per degree Celsius (C), and silicon expands three parts per million per degree C. For a three-inch (about one-tenth meter) long copper conductor, the difference in expansion between the copper conductor and the silicon substrate is 1.4 microns per degree C. For a one hundred degree Celsius temperature variation, the difference in expansion between the copper conductor and the silicon substrate is one hundred and forty microns. This significant difference in expansion leads to severe mechanical stress and is likely to cause the copper conductor to break.

Figure 1:
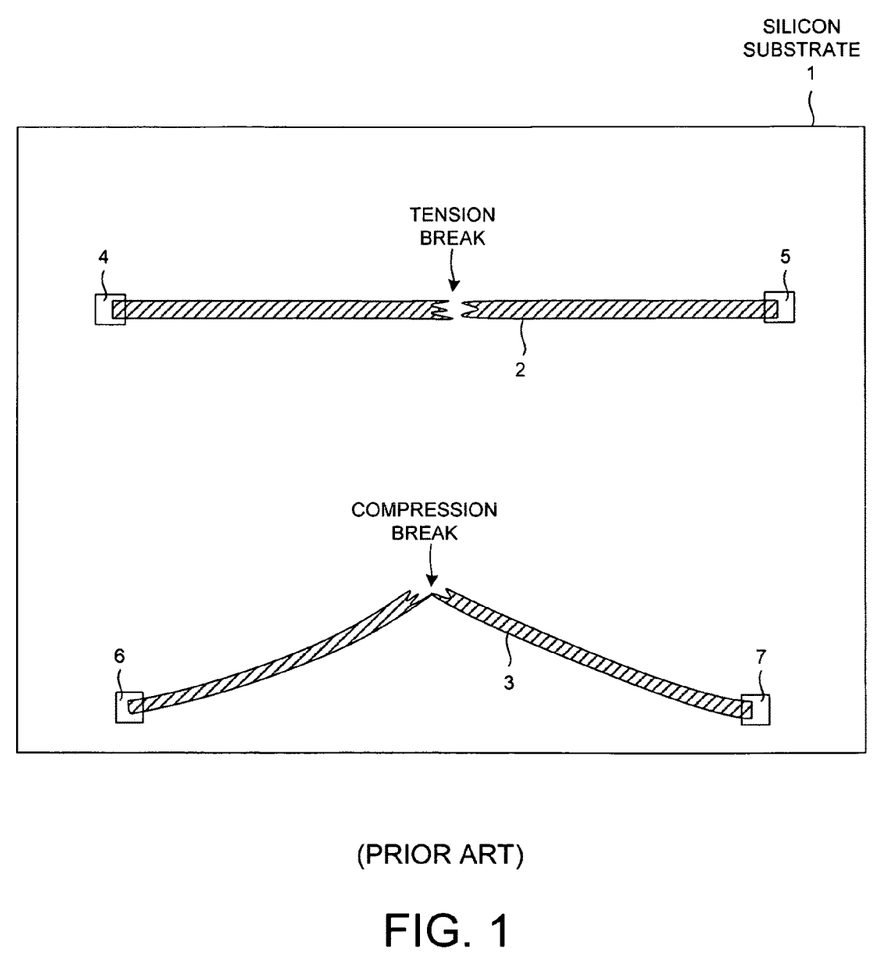
FIG. 1 (Prior Art) illustrates a simplified top-down view of a silicon substrate.

FIG. 1 (Prior Art) illustrates a simplified top-down view of a silicon substrate 1. Silicon substrate 1 includes a copper conductor 2 and a copper conductor 3. Copper conductor 2 is three inches long and connects pads 4 and 5. Copper conductor 3 is also three inches long and connects pads 6 and 7. As illustrated in FIG. 1, copper conductor 2 is straight and copper conductor 3 bends in the middle. When substrate 1 is temperature cycled over a range from zero to seventy degrees Celsius (the commercial temperature range), both copper conductors 2 and 3 would expand (when temperature increases) or contract (when temperature decreases) up to one hundred and twenty microns. However, pads 4-7 are fixed to the silicon substrate and expand or contract up to twenty microns. As a result, a tension break may occur in copper conductor 2 and a compression break may occur in copper conductor 3.

In the current semiconductor market, the size of an integrated circuit is in general much smaller than three inches on a side. For example, the largest Field Programmable Gate Array (FPGA) chip today is about one inch long on each side of the chip. For a copper conductor that is shorter than one inch, mechanical stress is usually not severe enough to cause the copper conductor to break. As a result, little effort has been directed to addressing the mechanical stress issue. However, in a large area of power and ground planes, long interconnect wires are preferred. Therefore, it is desirable to be able to fabricate a long signal conductor that is reliable and will not easily break due to temperature variations.

SUMMARY

An apparatus includes a volume of insulator disposed over a top surface of a semiconductor substrate, a tube of soft dielectric, and a metal conductor. The insulator has a hardness of more than approximately three gigaPascals (gPa) and the soft dielectric has a hardness of less than three gPa. The tube of soft dielectric and the metal conductor are both embedded within the volume of insulator. The tube defines a central volume and the metal conductor extends in a direction through the central volume for a distance of at least one inch long. The metal conductor is encircled by the soft dielectric when the apparatus is viewed in a cross-sectional plane perpendicular to the direction. The metal conductor also includes a plurality of bend portions. In one example, the soft dielectric is a low-k dielectric. In another example, the soft dielectric is Aerogel. Because of the softness of low-k dielectric or the fragility of Aerogel, the metal conductor will be able to expand into the surrounding soft dielectric during a temperature increase without causing mechanical stress which would otherwise result in destruction of the metal conductor. Therefore, the metal conductor does not break when the apparatus is temperature cycled over a range from zero to eighty five degrees Celsius.

In one embodiment, a top surface of the volume of insulator extends in a surface plane, and the metal conductor bends in a dimension parallel to the surface plane. There is at least one bend portion in each ten millimeter stretch of the metal conductor. Each one of the bend portions has an obtuse bend angle of more than ninety degrees. The metal conductor is able to extend its length by expanding toward the outside edge of each bend portion when temperature increases. Similarly, the metal conductor is able to shorten its length by contracting toward the inside edge of each bend portion when temperature decreases.

In another embodiment, a top surface of the volume of insulator extends in a surface plane, and the metal conductor bends in a dimension perpendicular to the surface plane. The metal conductor has a sine-wave shape. In yet another embodiment, the metal conductor has a cork-screw shape.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Figure 2:
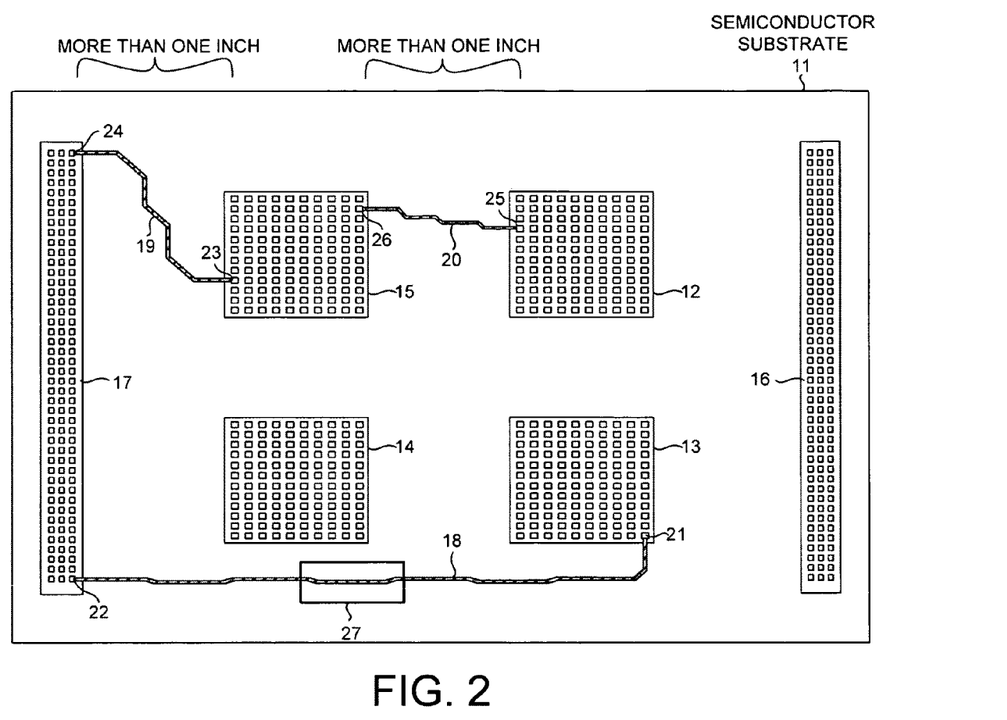
FIG. 2 is a simplified top-down view of a semiconductor substrate in accordance with one novel aspect.

FIG. 2 is a simplified top-down view of a semiconductor substrate 11 in accordance with one novel aspect. Semiconductor substrate (for instance, a monocrystalline silicon substrate) 11 includes four Field-Programmable Gate Array (FPGA) chips 12-15 and two conductive connector strips 16-17. Both FPGA chips and conductive connector strips include a plurality of pads that are interconnected by metal conductors. Through the metal conductors and conductive connector strips 16-17, FPGA chips 12-15 on semiconductor substrate 11 as well as other FPGA chips on other semiconductor substrates are interconnected. Three metal conductors (for instance, copper conductors) 18-20 are illustrated in the top-down view. Copper conductor 18 connects pads 21 and 22, copper conductor 19 connects pads 23 and 24, and copper conductor 20 connects pads 25 and 26. As illustrated in FIG. 1, the distance between conductive connector strip 17 and FPGA chip 14/15 is more than one inch, and the distance between FPGA chip 14/15 and FPGA chip 12/13 is also more than one inch. Therefore, both copper conductors 19 and 20 are longer than one inch, and copper conductor 18 is longer than two inches. In the example of FIG. 1, copper conductor 18 extends in a serpentine path having a plurality of bend portions, and copper conductors 19 and 20 extend in a diagonal path also having a plurality of bend portions. Each bend portion has a bend angle of greater than ninety degrees.

Figure 3:
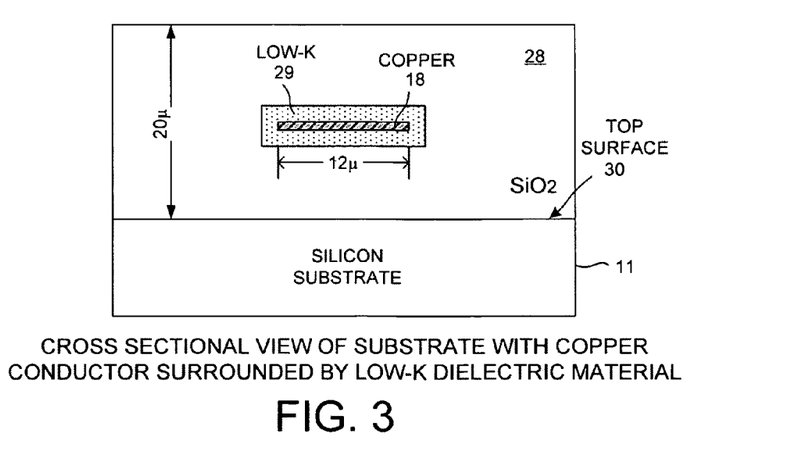
FIG. 3 is a simplified cross-sectional view of a portion of the semiconductor substrate of FIG. 2.

FIG. 3 is a simplified cross-sectional view of a portion of silicon substrate 11 that includes copper conductor 18 of FIG. 2. In the example of FIG. 3, a top surface 30 of silicon substrate 11 is covered by an insulating volume 28 (for instance, a volume of silicon dioxide (SiO.sub.2)) that is about twenty microns thick. Copper conductor 18 is a thin layer of copper embedded within insulating volume 28. As illustrated in the cross-sectional view, copper conductor 18 is twelve microns wide and is encircled by another thin layer of soft dielectric material 29 (for instance, a low-k dielectric) such that copper conductor 18 has no direct contact with the rigid material of silicon dioxide.

Silicon has a thermal expansion coefficient of three parts per million per degree Celsius, silicon dioxide has a thermal expansion coefficient of zero point five parts per million per degree Celsius, and copper has a thermal expansion coefficient of seventeen parts per million per degree Celsius. Because of the difference in thermal expansion coefficient, copper conductor 18 expands much more than the silicon substrate and the surrounding silicon dioxide during temperature increase. If copper conductor 18 is directly in contact with the rigid material of silicon dioxide, then such expansion will cause severe mechanical stress for copper conductor 18. Copper conductor 18 may eventually break because of the mechanical stress.

As illustrated in FIG. 3, copper conductor 18 is surrounded by soft dielectric 29 from the cross-sectional view. In one example, soft dielectric 29 is a soft low-k dielectric with a dielectric constant k of 3.5 or lower. The low-k dielectric selected is a soft/fragile material such as SiLK (organic polymer by Dow Chemical), FLARE (organic low-k poly ether by Allied Signal), or SOG (inorganic spin-on glass). These low-k dielectrics are soft and have hardnesses of three giga-Pascals (gPa) or lower. In another example, soft dielectric 29 is a fragile low-k and low-density solid such as Aerogel. Aerogel is a material derived from gel in which the liquid component of the gel has been replaced with gas. The resulted Aerogel is an extremely low density and fragile solid that can be effectively used as an insulator. Because of the softness of low-k dielectric or the fragility of Aerogel, copper conductor 18 will be able to compress into the surrounding soft dielectric 29 and expand to become wider and thicker during temperature increase.

However, the expansion of copper conductor 18 is three-dimensional and proportionate to its length, width, and thickness. Because copper conductor 18 is a long and thin line connecting pads 21 and 22, copper conductor 18 is likely to expand much more along its length as compare to its width and thickness. Pads 21 and 22 are fixed on the silicon substrate, and when the silicon substrate expands or contracts due to temperature variations, the distance between pad 21 and pad 22 varies accordingly. Therefore, if copper conductor is a straight line without any bend portion, then copper conductor 18 will only be able to expand along its length by the same amount as the silicon substrate expands. Therefore, copper conductor 18 is still under severe mechanical stress if it is a straight long line.

Figure 4:
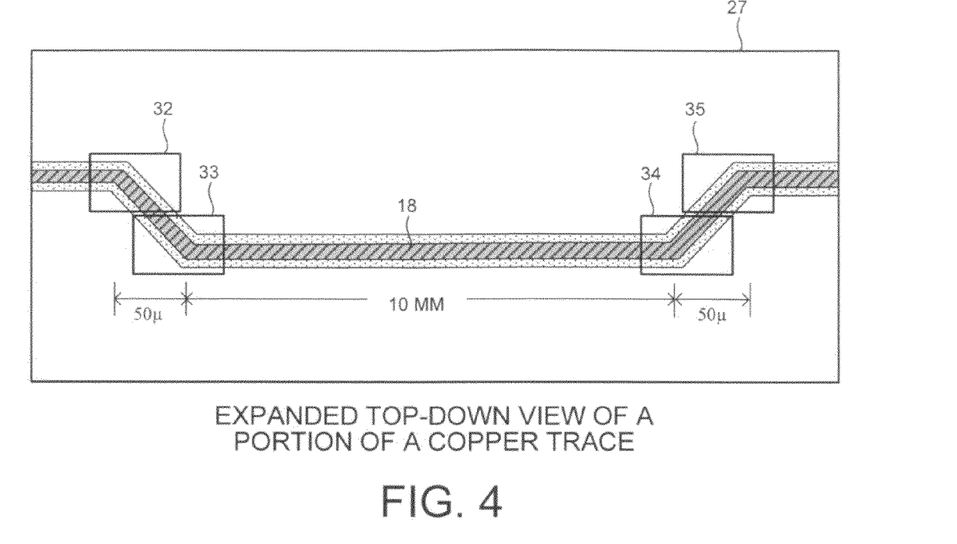
FIG. 4 is a top-down view of a copper trace with several bend portions.

FIG. 4 is an expanded top-down view of a portion 27 of copper conductor 18 of FIG. 2. Instead of being a straight line, copper conductor 18 includes a plurality of bend portions. Four bend portions 32-35 are illustrated in the expanded top-down view. Each bend portion has an obtuse bend angle. Bend portions 32 and 33, and bend portions 34 and 35 are approximately fifty microns apart from each other. Bend portions 33 and 34 are approximately ten millimeters apart from each other.

Figure 4A:
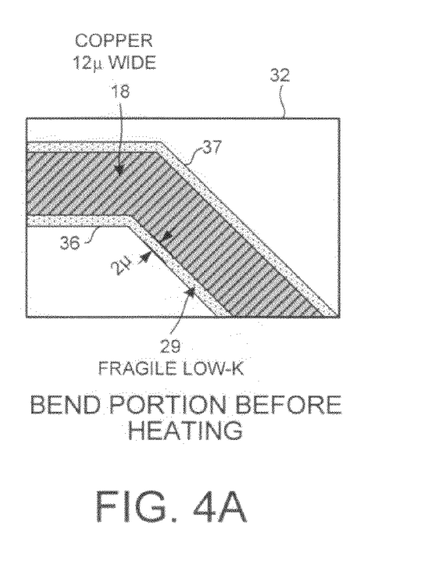
FIG. 4A is an expanded top-down view of a bend portion of the copper trace of FIG. 4 in a cool temperature condition.

FIG. 4A is a further expanded view of bend portion 32 of FIG. 4 in a cool temperature condition. Bend portion 32 includes an inside edge 36 and an outside edge 37. From the top-down view of FIG. 4A, copper conductor 18 is 12 microns wide and is located exactly in the middle of the surrounding soft dielectric 29. Both inside edge 36 and outside edge 37 of bend portion 32 are approximately two microns away from the encircled copper in cool temperature condition.

Figure 4B:
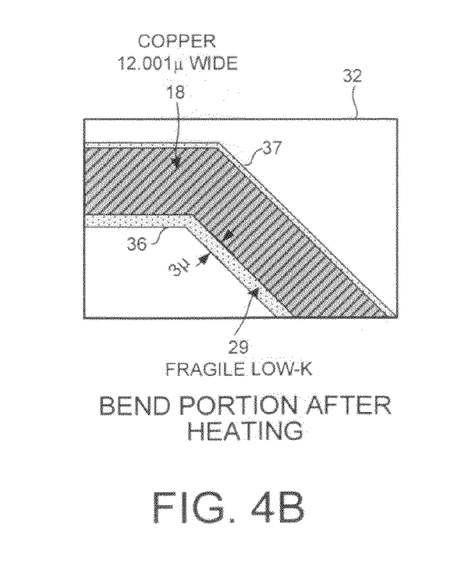
FIG. 4B is an expanded top-down view of the bend portion of the copper trace of FIG. 4 in a warm temperature condition.

FIG. 4B is a further expanded view of bend portion 32 of FIG. 4 in a warm temperature. When temperature increases, copper conductor 18 starts to expand. Because copper conductor 18 is encircled by soft dielectric 29, it is able to compress into the surrounding soft dielectric and expand from 12 microns wide to 12.001 microns wide. Furthermore, copper conductor 18 is able to shift toward outside edge 37 of bend portion 32 to extend its length. From the illustrated top-town view, inside edge 36 is approximately three microns away from the encircled copper, and outside edge 37 is approximately one micron away from the encircled copper. As a result, copper conductor 18 becomes longer by shifting toward outside edge 37 of bend portion 32. Therefore, by periodically bending copper conductor 18, copper conductor 18 is able to extend its length by shifting toward the outside edge of each bend portion when temperature increases. Similarly, copper conductor 18 is able to shorten its length by shifting toward the inside edge of each bend portion when temperature decreases. The flexibility of shifting within the surrounding soft dielectric substantially reduces the mechanical stress on copper conductor 18.

Figure 5:
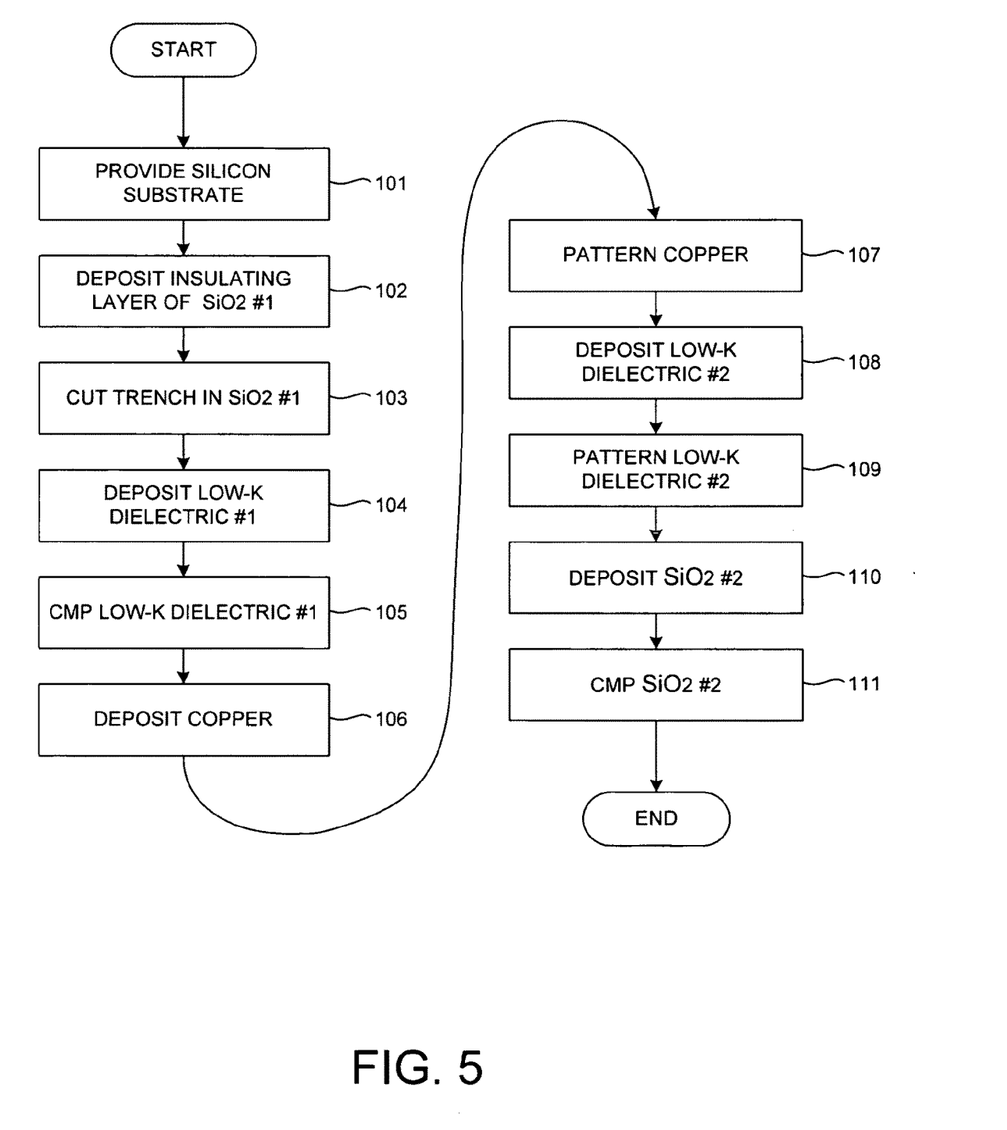
FIG. 5 is a flow chart that illustrates a method of fabricating a long copper conductor in accordance with one novel aspect.
Figure 6:
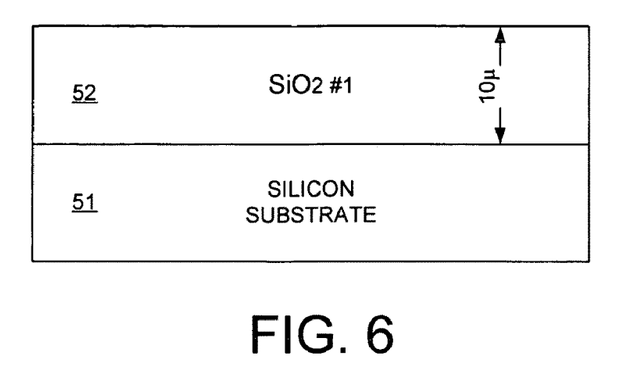
FIGS. 6, 7, 8, 9, 10 and 11 are simplified cross-sectional diagrams that illustrate the method of fabricating a copper conductor of FIG. 5.

FIG. 5 is a flow chart of a method of fabricating a copper conductor in accordance with one novel aspect. FIGS. 6-11 are simplified cross-sectional diagrams that correspond to the method of FIG. 5. In Step 101, silicon substrate 51 is provided. In step 102, a first insulating layer 52 of silicon dioxide #1 (SiO.sub.2) is formed on a top surface of silicon substrate 51. First insulating layer 52 is approximately ten microns thick. FIG. 6 is a cross-sectional diagram of silicon substrate 51 covered by first insulating layer 52.

Figure 7:
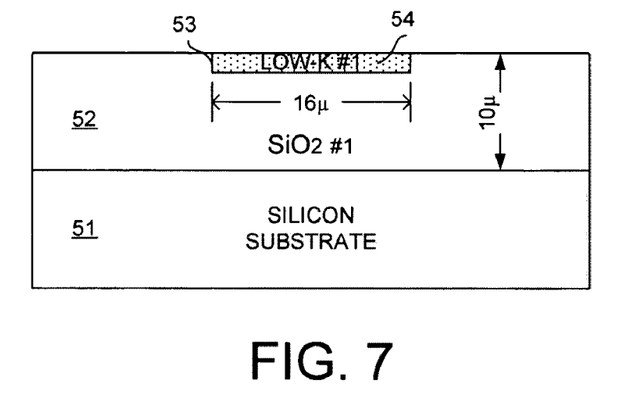

In step 103, a first trench 53 is created in first insulating layer 52. Trench 53 is located where a future copper conductor will be deposited later on. However, trench 53 is a few microns wider than the future copper conductor. For example, if the future copper conductor is twelve microns wide and two microns deep, then trench 53 is sixteen microns wide and two microns deep. In step 104, a first soft layer 54 of low-k dielectric #1 is deposited on a top surface of first insulating layer 52 such that trench 53 is filled up with low-k dielectric #1. In step 105, the excessive amount of low-k dielectric is then removed by using a chemical mechanical polishing (CMP) process. FIG. 7 illustrates the cross-sectional view of substrate 51 after step 105.

Figure 8:
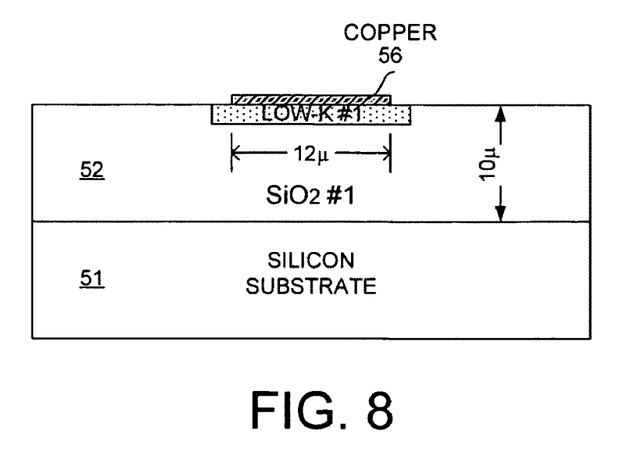

In step 106, a layer of copper is deposited on the top surface of first insulating layer 52. In step 107, the layer of copper is patterned according to the area where copper conductor 56 is located. FIG. 8 illustrates the cross-sectional view of substrate 51 after step 107. From the illustrated cross-sectional view, copper conductor 56 is twelve microns wide, and is located right above trench 53 filled with low-k dielectric #1.

Figure 9:
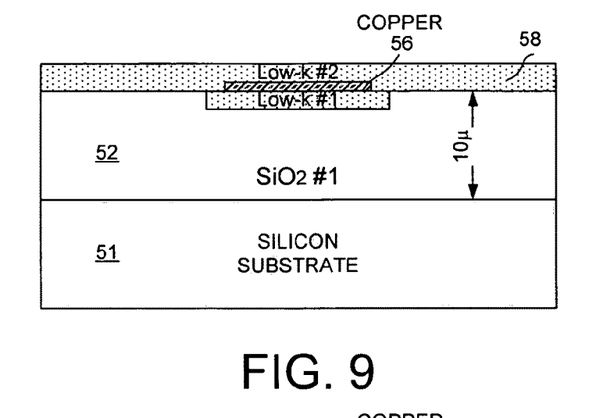

In step 108, a second soft layer 58 of low-k dielectric #2 is deposited on the top surface of first insulating layer 52 and copper conductor 56. The second soft layer 58 of low-k dielectric #2 is a relatively thin layer as compared to first insulating layer 52. FIG. 9 illustrates the cross-sectional view of substrate 51 after step 108.

Figure 10:
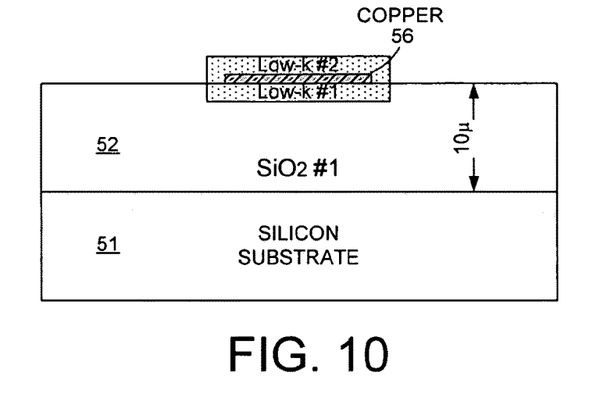

In step 109, the second soft layer 58 of low-k dielectric #2 is patterned according to the same area where trench 53 is located. FIG. 10 illustrates the cross-sectional view of substrate 51 after step 109. From the illustrated cross-sectional view, copper conductor 56 is completely encircled by first soft layers 54 and second soft layer 58 of low-k dielectric.

Figure 11:
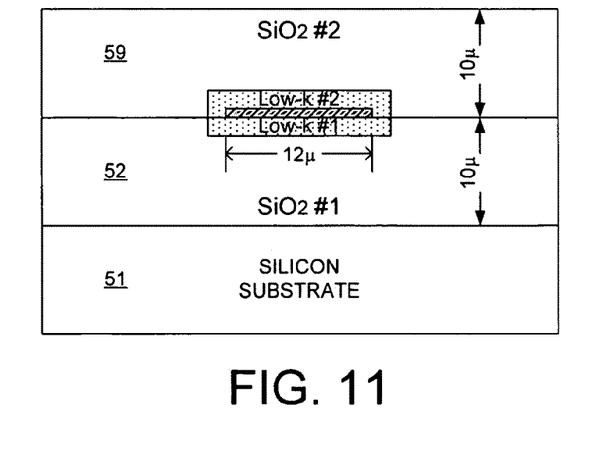

In step 110, a second insulating layer 59 of silicon dioxide #2 is deposited on the top surface of first insulating 52. In step 111, the excessive amount of silicon dioxide is then removed by using a chemical mechanical polishing (CMP) process. Second insulating layer 59 is approximately ten microns thick. FIG. 11 illustrates the cross-sectional view of substrate 51 after step 111. From the illustrated cross-sectional view, copper conductor 56 is completely encircled by first soft layers 54 and second soft layer 58 of low-k dielectric. In addition, copper conductor 56, first soft layer 54 of low-k dielectric #1, and second soft layer 58 of low-k dielectric #2 are all embedded within the first and second insulating layers of silicon dioxide.

In the above illustrated example, a long copper conductor is fabricated in a way such that it is embedded within an insulating layer and is also encircled by a soft dielectric. In addition, by introducing periodic bend portions as described in FIG. 4, the copper conductor is able to extend its length, width and thickness by crushing into the surrounding soft dielectric when temperature increases. Therefore, the copper conductor is more reliable and less likely to break even if it has a length of more than three inches.

Figure 12:
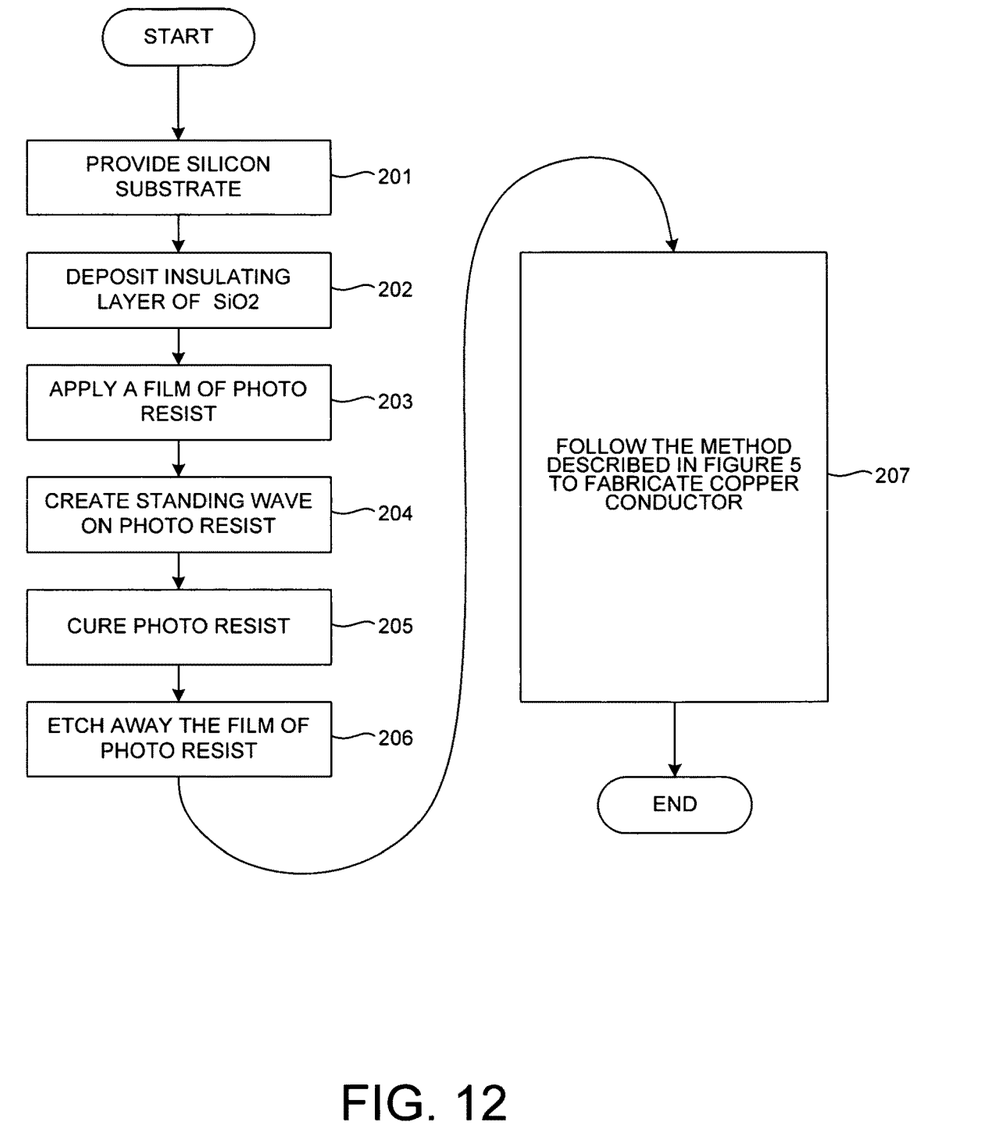
FIG. 12 is a flow chart that illustrates a method of fabricating a long copper conductor in accordance with another novel aspect.
Figure 13:
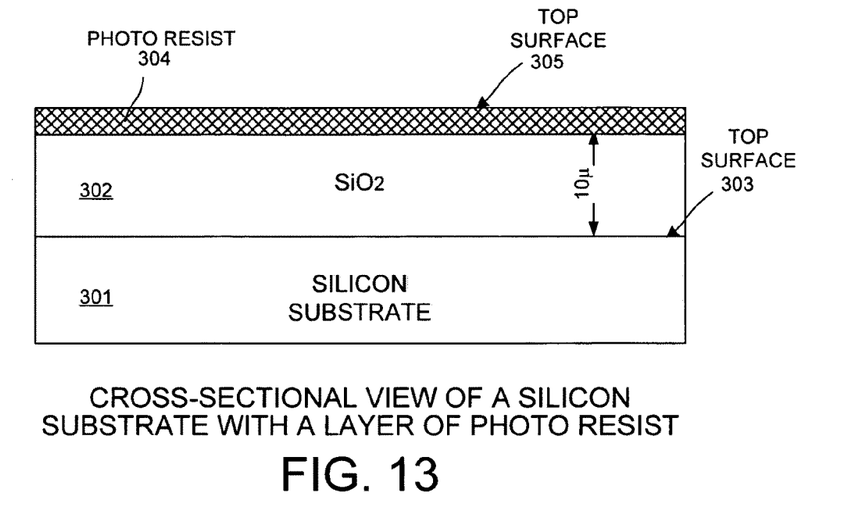
FIG. 13 is a simplified cross-sectional view of a semiconductor substrate having a layer of photo resist.

FIG. 12 is a flow chart of a method of fabricating a copper conductor in accordance with another novel aspect. FIGS. 13-16 are diagrams that correspond to the method of FIG. 12. In step 201, silicon substrate 301 is provided. In step 202, a first insulating layer 302 of silicon dioxide #1 (SiO.sub.2) is deposited on a top surface 303 of silicon substrate 301. First insulating layer 302 is approximately ten microns thick. In step 203, a thin photo resist layer (for instance, a liquid spin-on resist) 304 is deposited on top of insulating layer 302. In one example, photo resist layer 304 is deposited by spin-on deposition and has a flat top surface 305. FIG. 13 is a cross-sectional diagram of silicon substrate 301 having first insulating layer 302 and photo resist layer 304.

Figure 14:
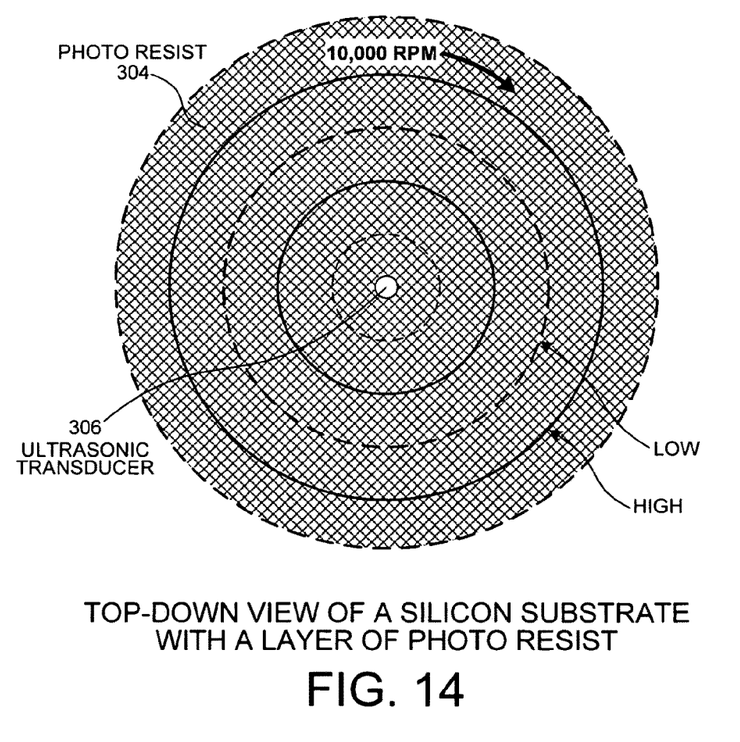
FIG. 14 is a top-down view of a semiconductor substrate covered by a layer of photo resist having an angular surface.

In step 204, a standing wave is created in photo resist layer 304 using an ultrasonic transducer. FIG. 14 illustrates a top-down view of silicon substrate 301 with an ultrasonic transducer 306 attached to the center of silicon substrate 301. In the example of FIG. 14, ultrasonic transducer 306 vibrates at a rate of about 10,000 Hz. The vibration creates a sine wave on top surface 305 of photo resist layer 304. By adjusting the frequency and amplitude of the ultrasonic signal, a standing wave with periodic highs and lows is created on top surface 305. Form the illustrated top-down view, circles of dashed line represent low points on top surface 305, and circles of solid line represent high points on top surface 305.

Figure 15:
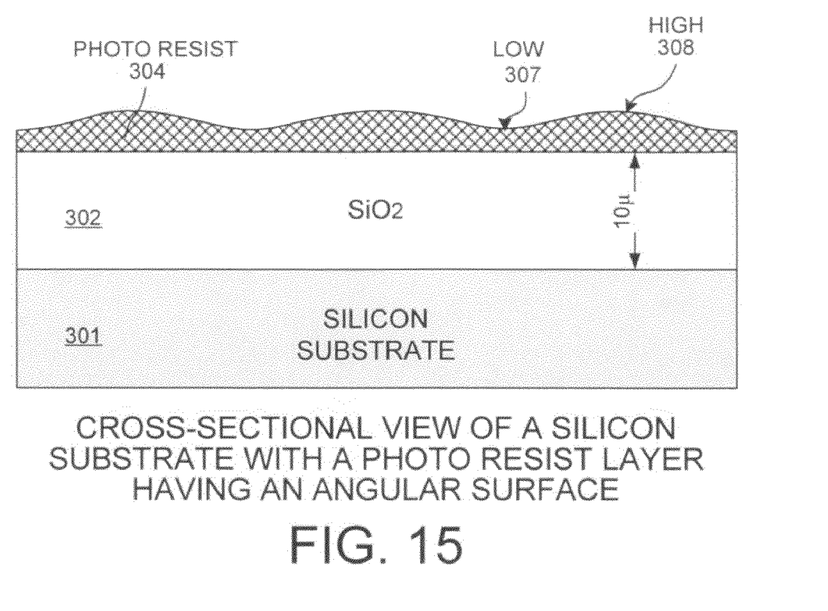
FIG. 15 is cross-sectional view of the semiconductor substrate of FIG. 15.

In step 205, photo resist layer 304 is cured while top surface 305 is in the standing wave state. In one example, silicon substrate 301 is baked in an oven to solidify the liquid photo resist layer 304. FIG. 15 is a cross-sectional diagram of silicon substrate 301 having first insulating layer 302 and photo resist layer 304. Top surface 305 of photo resist 304 has a cross-sectional sine wave view with periodic lows and highs. A low point 307 and a high point 308 on top surface 305 are illustrated in the cross-sectional view.

Figure 16:
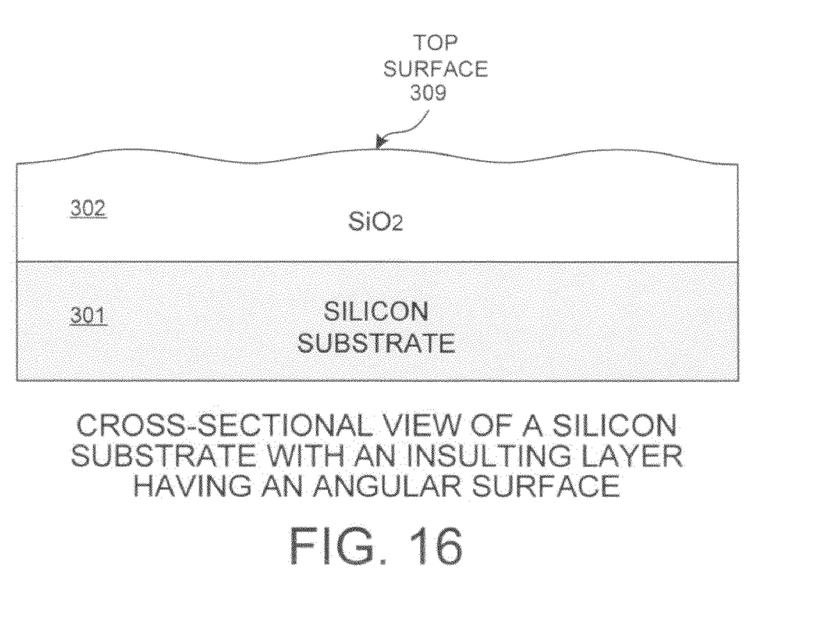
FIG. 16 is a cross-sectional view of a semiconductor substrate covered by a layer of silicon dioxide having an angular surface.

In step 206, photo resist layer 304 is etched away using a selected etchant. By selecting an etchant such that photo resist and silicon dioxide have approximately the same etch sensitivity, both photo resist layer 304 and insulating layer 302 etches at approximately the same rate. As a result, when photo resist layer 304 is completely etched away, the remaining insulating layer 302 forms an angulated top surface that is approximately same as top surface 305 of photo resist layer 304 before etching. FIG. 16 illustrates a cross-sectional view of silicon substrate 301 having first insulating layer 302 after etching. Top surface 309 of insulating layer 302 after etching has a cross-sectional sine wave view, which is the same cross-sectional view of top surface 305 of photo resist layer 304 before etching.

Figure 17:
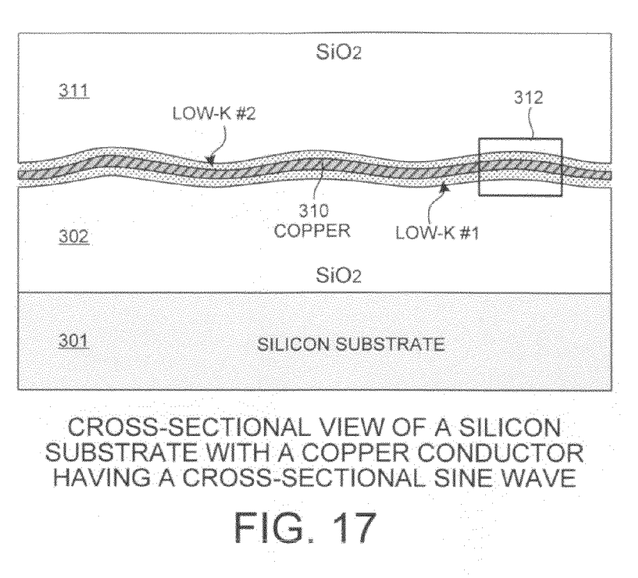
FIG. 17 illustrates a copper conductor having a cross-sectional sine wave shape. The conductor is embedded within an insulating layer on a semiconductor substrate.

In step 207, a copper conductor 310 is fabricated by following the same method illustrated in FIG. 5. First, a first layer of low-k dielectric is deposited on top of first insulating layer 302. Second, a layer of copper is deposited on top of the first layer of low-k dielectric. Next, a second layer of low-k dielectric is deposited on top of the layer of copper. Finally, a second insulating layer 311 is deposited on top of the second layer of low-k dielectric. FIG. 17 illustrates a cross-sectional view of silicon substrate 301 with copper conductor 310. As illustrated in FIG. 17, copper conductor 310 has a cross-sectional sine wave view with a plurality of bend portions located at the highs and lows of the sine wave. For example, bend portion 312 is located at one of the high points of the sine wave.

Figure 18A:
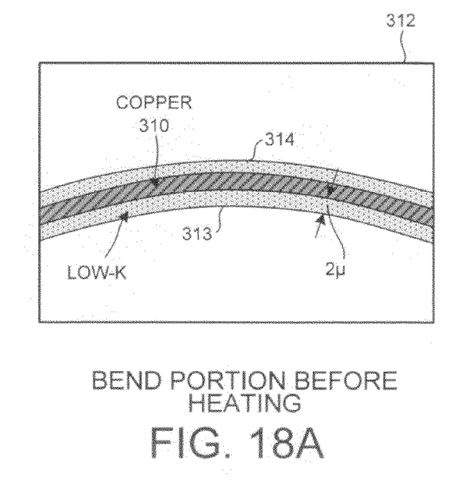
FIG. 18A is an expanded top-down view of a bend portion of the copper trace of FIG. 18 in a cool temperature condition.

FIG. 18A is an expanded view of bend portion 312 of FIG. 17 in cool temperature condition. Bend portion 312 includes an inside edge 313 and an outside edge 314. From the cross-sectional view of FIG. 18A, copper conductor 310 is located exactly in the middle of the surrounding low-k dielectric layer. Both inside edge 313 and outside edge 314 of bend portion 312 are approximately two microns away from the encircled copper in cool temperature condition.

Figure 18B:
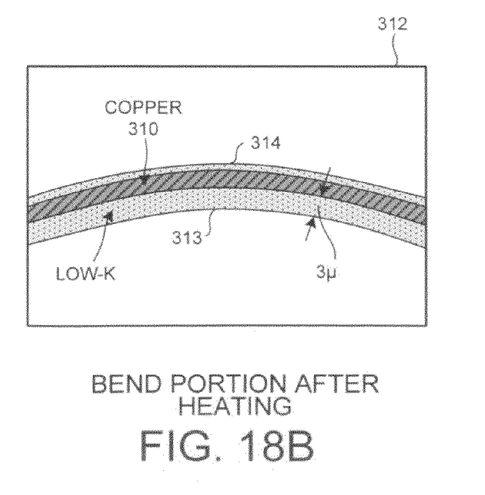
FIG. 18B is an expanded top-down view of a bend portion of the copper trace of FIG. 18 in a warm temperature condition.

FIG. 18B is an expanded view of bend portion 312 of FIG. 17 in warm temperature condition. When temperature increases, copper conductor 310 starts to expand. Because copper conductor 310 is encircled by soft low-k dielectric, it is able to crush into the surrounding low-k dielectric. Furthermore, it is able to shift toward outside edge 314 of bend portion 312. From the illustrated cross-sectional view, inside edge 313 is approximately three microns away from the encircled copper, and outside edge 314 is approximately one micron away from the encircled copper. As a result, copper conductor 310 becomes longer by shifting toward outside edge 314 of bend portion 312. Therefore, by periodically bending copper conductor 310, copper conductor 310 is able to extend its length by shifting toward to the outside edge of each bend portion when temperature increases. Similarly, copper conductor 310 is able to shorten its length by shifting toward to the inside edge of each bend portion when temperature decreases. The flexibility of shifting within the surrounding soft dielectric substantially reduces the mechanical stress of copper conductor 310.

In one example, copper conductor 310 of FIG. 17 also has a top-down serpentine view. In addition to bend portions that bend vertically as illustrated in FIG. 17, copper 310 also includes a plurality of bend portions that bend horizontally, as illustrated in FIG. 4. The resulted copper conductor has a cork-screw shape. By bending back and forth horizontally and up and down vertically, copper conductor 310 can be used as a high frequency inductor.

Although certain specific embodiments are described above for instructional purposes, the teachings of this patent document have general applicability and are not limited to the specific embodiments described above. Although several ways are described above for fabricating a metal conductor that is embedded in a dielectric where the metal conductor is fashioned so that it can contract and expand within the sheath of dielectric, any suitable way of fabricating the structure can be employed. The dielectric can be a soft dielectric material that absorbs stresses by compressing, or the dielectric can be a fragile dielectric that breaks and/or crushes and thereby prevents stresses from accumulating. The long metal conductor structure that does not break despite differential thermal expansion and thermal contraction between the long metal conductor and a supporting semiconductor substrate sees use in the semiconductor substrates of a novel semiconductor substrate elastomeric stack computer. For additional detail on the semiconductor substrate elastomeric stack computer, including detail on the semiconductor substrates, see: U.S. Provisional Application No. 60/995,194, entitled "Semiconductor Substrate Stack High Performance Computer," filed on Sep. 24, 2007 (the subject matter of which is incorporated herein by reference). Accordingly, various modifications, adaptations, and combinations of various features of the described embodiments can be practiced without departing from the scope of the invention as set forth in the claims.

What is claimed is:

1. A method comprising:
   (a) providing a semiconductor substrate with a first insulating layer, wherein the semiconductor substrate has a surface plane;
   (b) fabricating a metal conductor having a length of at least one inch, wherein the metal conductor extends in a direction parallel to the surface plane, wherein the metal conductor is encircled by a soft dielectric when the metal conductor is viewed in a cross-sectional plane perpendicular to the direction, and wherein the metal conductor includes a plurality of bend portions; and
   (c) depositing a second insulating layer such that both the metal conductor and the soft dielectric are embedded within the first and the second insulating layers, wherein the first and second insulating layers have hardnesses of more than approximately three gigaPascals (gPa), and wherein the soft dielectric has a hardness of less than three gPa.

2. The method of claim 1, wherein the metal conductor expands due to increased temperature such that the soft dielectric gets compressed at a plurality of locations that correspond to the plurality of bend portions.

3. The method of claim 1, wherein there is at least one bend portion in each ten millimeter length of the metal conductor.

4. The method of claim 1, wherein the metal conductor bends in a dimension parallel to the surface plane, and wherein each one of the plurality of bend portions has a bend angle of more than ninety degrees.

5. The method of claim 1, wherein step (a) involves:
   covering the first insulating layer with a layer of photo resist having a sine wave surface;
   selecting an etchant such that the photo resist and the first insulating layer have approximately the same etch sensitivity; and
   etching away the photo resist using the selected etchant such that the first insulating layer forms another sine wave surface.

6. The method of claim 5, wherein the metal conductor bends in a dimension perpendicular to the surface plane.

7. The method of claim 6, wherein the metal conductor has a sine wave shape.

8. The method of claim 1, wherein the second insulating layer is silicon dioxide.

9. The method of claim 1, wherein the soft dielectric has a rectangular outer peripheral edge when viewed in the cross-sectional plane.

10. The method of claim 1, wherein the metal conductor has a cork-screw shape.

11. The method of claim 1, wherein the soft dielectric is a low-k dielectric taken from the group consisting of: Aerogel, fluorinated silicon glass (FSG), aromatic hydrocarbon-based dielectric material (SilK), and fluorinated poly (arylene ether) (FLARE).

12. A method comprising:
   conducting a signal through a metal conductor without breaking the metal conductor when the temperature of the metal conductor is temperature cycled over a range from zero to eighty-five degrees Celsius, wherein the metal conductor is at least one inch long in an axial direction and includes a plurality of bend portions, wherein the metal conductor is encircled by a soft dielectric when viewed in a cross-sectional plane perpendicular to the axial direction, wherein the soft dielectric is embedded within a volume of insulator, and wherein the volume of insulator is disposed over a top surface of a semiconductor substrate.

13. The method of claim 12, wherein there is at least one bend portion in each ten millimeter length of the metal conductor, and wherein each one of the plurality of bend portions has a bend angle of more than ninety degrees.

14. The method of claim 12, wherein the soft dielectric has a hardness of less than three gigaPascals, and the insulator has a hardness of more than three gigaPascals.

15. The method of claim 12, wherein the insulator is silicon dioxide.

16. The method of claim 12, further comprising:
compressing the soft dielectric at a plurality of locations that correspond to the plurality of bend portions when the temperature of the metal conductor is increased.

17. The method of claim 12, wherein the metal conductor expands when the temperature of the metal conductor increases such that the soft dielectric is compressed at a plurality of locations that correspond to the plurality of bend portions.

18. The method of claim 12, further comprising:
bending the metal conductor in a dimension parallel to a plane defined by the top surface of the semiconductor substrate when the temperature of the metal conductor is increased.

19. The method of claim 12, further comprising:
bending the metal conductor in a dimension perpendicular to a plane defined by the top surface of the semiconductor substrate when the temperature of the metal conductor is increased.

20. The method of claim 12, wherein the signal is conducted through the metal conductor to a pad of a Field Programmable Gate Array (FPGA) chip.

* * * * *